US009035245B2

(12) United States Patent
Glasmachers et al.

(10) Patent No.: US 9,035,245 B2
(45) Date of Patent: May 19, 2015

(54) DEVICE FOR MASS SELECTIVE DETERMINATION OF AN ION

(71) Applicant: Carl Zeiss Microscopy GmbH, Jena (DE)

(72) Inventors: Albrecht Glasmachers, Wetter (DE); Michel Aliman, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/277,933

(22) Filed: May 15, 2014

(65) Prior Publication Data

US 2014/0339424 A1 Nov. 20, 2014

(30) Foreign Application Priority Data

May 15, 2013 (DE) .......................... 10 2013 208 959

(51) Int. Cl.
*H01J 37/05* (2006.01)
*H01J 49/02* (2006.01)
*H01J 49/42* (2006.01)
*H01J 37/244* (2006.01)
*H01J 37/252* (2006.01)

(52) U.S. Cl.
CPC ............... *H01J 37/05* (2013.01); *H01J 49/022* (2013.01); *H01J 49/424* (2013.01); *H01J 37/244* (2013.01); *H01J 37/252* (2013.01); *H01J 2237/028* (2013.01); *H01J 2237/057* (2013.01)

(58) Field of Classification Search
USPC ....... 250/291, 292, 281, 282, 396 R, 396 ML
See application file for complete search history.

(56) References Cited

U.S. PATENT DOCUMENTS 4,755,670 A * 7/1988 Syka et al. .................... 250/292
5,420,425 A * 5/1995 Bier et al. ..................... 250/292
5,572,022 A * 11/1996 Schwartz et al. ............. 250/282

(Continued)

FOREIGN PATENT DOCUMENTS

DE    695 02 662 T2    12/1998
DE    699 06 699 T2    10/2003

(Continued)

OTHER PUBLICATIONS

M. Aliman et al., "A Novel Electric Ion Resonance Cell Design with High Signal-to-Noise Ratio and Low Distortion for Fourier Transform Mass Spectrometry," Journal of the American Society for Mass Spectrometry 1999, 10, pp. 1000-1007.

(Continued)

*Primary Examiner* — Kiet T Nguyen
(74) *Attorney, Agent, or Firm* — Muirhead and Saturnelli, LLC

(57) ABSTRACT

A device for mass selective determination of at least one ion or of a plurality of ions is used, for example, in a measuring apparatus having an ion trap. The ion trap has a ring electrode having a first opening. A first electrode is arranged at the first opening. Furthermore, an amplifier for providing a radio-frequency storage signal for the ion trap and a first transformer are provided, said first transformer being connected to the amplifier and the first electrode in such a way that the radio-frequency storage signal is coupled into the first electrode via the first transformer.

25 Claims, 5 Drawing Sheets

(56) References Cited

U.S. PATENT DOCUMENTS

| | | | |
|---|---|---|---|
| 6,191,417 | B1 | 2/2001 | Douglas et al. |
| 6,844,547 | B2 * | 1/2005 | Syka .............................. 250/292 |
| 2003/0155502 | A1 | 8/2003 | Grosshans et al. |
| 2006/0038123 | A1 | 2/2006 | Quarmby |
| 2006/0163472 | A1 | 7/2006 | Marquette |

FOREIGN PATENT DOCUMENTS

| | | | |
|---|---|---|---|
| EP | 0 684 628 | B1 | 5/1998 |
| EP | 1 051 730 | B1 | 4/2003 |

OTHER PUBLICATIONS

M. Aliman et al., "Automatic Crosstalk Compensation Techniques for Fourier Transform Mass Spectrometry with an Electric Ion Resonance Trap (ACC)," 55th ASMS Conference, Indianapolis (USA) 2007, 2 pp.

Douglas E Goeringer et al., "Ion Remeasurement in the Radio Frequency Quadrupole Ion Trap", Analytical Chemistry, vol. 67, No. 22, Nov. 1995, pp. 4164-4169.

M. Nappi et al., "Characteristics of a broad-band Fourier transform ion trap mass spectrometer", International Journal of Mass Spectrometry, vol. 177, No. 1, Aug. 1998, pp. 91-104.

* cited by examiner

DEVICE FOR MASS SELECTIVE DETERMINATION OF AN ION

TECHNICAL FIELD

This application relates to a device for mass selective measurement of at least one ion or of a plurality of ions. In particular, the device may serve for determination of the ion or of the plurality of ions.

BACKGROUND OF THE INVENTION

Particle beam apparatuses have already long been used to obtain insights with regard to the properties and behavior of objects under specific conditions. One of these particle beam apparatuses is an electron beam apparatus, in particular a scanning electron microscope (also called SEM hereinafter).

In the case of an SEM, an electron beam (also called primary electron beam hereinafter) is generated using a beam generator and focused by a beam guiding system, in particular an objective lens, onto an object to be examined (also called sample). Using a deflection device, the primary electron beam is guided in a raster-type fashion over a surface of the object to be examined. In this case, the electrons of the primary electron beam interact with the material of the object to be examined. As a consequence of the interaction, in particular interaction particles arise. In particular, electrons are emitted from the surface of the sample to be examined (so-called secondary electrons) and electrons of the primary electron beam are backscattered (so-called backscattered electrons). The secondary electrons and backscattered electrons are detected and used for image generation. An imaging of the surface of the object to be examined is thus obtained.

Furthermore, it is known from the prior art to use combination apparatuses for examining objects, in which both electrons and ions can be guided onto an object to be examined. By way of example, it is known to additionally equip an SEM with an ion beam column. Using an ion beam generator arranged in the ion beam column, ions are generated which are used for preparing an object (for example removing a surface of an object or applying material to the object) or alternatively for imaging. In this case, the SEM serves, in particular, for observing the preparation, but also for further examination of the prepared or unprepared object.

Besides the image generation already mentioned above, it is also possible to analyze interaction particles in greater detail with regard to their energy and/or their mass. A method is known from mass spectrometry, for example, in which method secondary ions are examined in greater detail. The method is known by the abbreviation SIMS (Secondary Ion Mass Spectrometry). In this method, the surface of an object to be examined is irradiated with a focused primary ion beam or with a laser beam. The interaction particles that arise in this case in the form of secondary ions emitted from the surface of the sample are detected and examined by mass spectrometry in an analysis unit. In this case, the secondary ions are selected and identified on the basis of their ion mass and their ion charge, such that conclusions can be drawn about the composition of the object.

The prior art discloses an analysis unit embodied, for example, as an ion trap mass spectrometer. In the case of the known ion trap mass spectrometer, a storage cell is embodied as a Paul trap. It has a ring electrode, a first end cap electrode and a second end cap electrode. The ring electrode is arranged rotationally symmetrically about a first axis. The first end cap electrode and the second end cap electrode are likewise arranged rotationally symmetrically about the first axis. The ring electrode, the first end cap electrode and the second end cap electrode encompass an interior of the storage cell. The ring electrode has an opening through which secondary ions can be coupled into the interior of the storage cell. The ions are dynamically stored in the ion trap mass spectrometer on the basis of an alternating field. An electric quadrupole field is generally used as the alternating field. In order to measure the mass to charge ratio, the ions are excited by an excitation signal to effect oscillations, the frequency of which is dependent on the ion mass. The oscillation information is tapped off at the first end cap electrode and the second end cap electrode and evaluated. For this purpose, measurement currents that arise as a result of induced image charges are measured at the end cap electrodes.

Disturbing effects in the form of crosstalk currents occur, however, in the case of the ion trap mass spectrometer described above. In this regard, a first crosstalk current arises on account of a first interaction of the alternating field with the first end cap electrode. Furthermore, a second crosstalk current arises on account of a second interaction of the alternating field with the second end cap electrode. The first crosstalk current has a first frequency, a first amplitude and a first phase. Furthermore, the second crosstalk current has a second frequency, a second amplitude and a second phase. The crosstalk currents are usually greater than the actual measurement current by a multiple. At the first end cap electrode and at the second end cap electrode, a current (also called measurement signal hereinafter) composed of the actual measurement current and the crosstalk current is tapped off, and is generally amplified by a measurement amplifier. The measurement amplifier is often overdriven on account of the high crosstalk current, and so the amplified signal of the measurement amplifier yields no useable information about the stored ion.

A solution to this problem is known from the prior art. In this solution, the measurement signal is measured at the first end cap electrode. Furthermore, a first compensation current is provided, the first compensation current likewise having the first frequency and the first amplitude. Furthermore, the first compensation current has a first compensation phase, which is offset by 180° with respect to the first phase of the first crosstalk current. Afterward, the first compensation current is superposed with the first measurement signal in such a way that a first resultant signal arises. By filtering the first resultant signal, a first filter signal is ascertained, wherein the latter substantially comprises the first measurement current, that is to say the actual measurement signal. Afterward, the first filtered signal is amplified using a measurement amplifier and the amplified filtered signal is subsequently evaluated in order to determine the ion or the ions. The same is also analogously effected with the second measurement signal at the second end cap electrode.

The above-mentioned procedure is generally made available by a complex implementation using software. Direct digital syntheses (DDS) are used for this purpose. These are methods for generating periodic, band-limited signals in digital signal processing. However, the software is complex in its programming and often also has errors.

Therefore, it would be desirable to specify a device for mass selective determination of ions in which a compensation of the crosstalk current with a compensation current and downstream filtering of the resultant signal can be provided more simply.

SUMMARY OF THE INVENTION

According to the system described herein, a device for mass selective determination of at least one ion or of a plurality of ions has at least one ion trap for storing at least one ion or a plurality of ions. The generation of the ion or ions is described in greater detail further below. The ion is embodied for example as an electrically charged atom or as an electrically charged molecule. The ion trap has at least one ring electrode, wherein the ring electrode has at least one first opening. The ion trap is furthermore provided with at least one first electrode (also called first end cap electrode) arranged at the first opening. Furthermore, the device according to the system described herein may be provided with an amplifier for providing a radio-frequency storage signal for the ion trap. The radio-frequency storage signal serves for storing the ion in an interior formed by the ring electrode and the first electrode (and also, if appropriate, by a second electrode; this is explained further below). In other words, the ring electrode and the first electrode (and also, if appropriate, the second electrode) form the boundary of the interior. The storage frequency is in the range of 10 kHz to 10 MHz, for example, and is the storage frequency of an electrical AC voltage used for generating an alternating electrostatic field. By way of example, the AC voltage is in the range of 10 V to 10 kV.

The device according to the system described herein may be used, for example, in a particle beam apparatus having an ion trap. Ions are stored in the ion trap using electric fields and/or magnetic fields. The ions stored in the ion trap can be examined by mass spectrometry. By way of example, this is carried out depending on the type and strength of the electric fields and magnetic fields acting on the ions. Alternatively, ions having specific masses can be inferred and analyzed by varying the electric fields and magnetic fields.

The device according to the system described herein furthermore may have a first transformer, which is connected to the amplifier and the first electrode in such a way that the radio-frequency storage signal is coupled into the first electrode via the first transformer. In other words, the connection of the amplifier to the first electrode is designed for coupling in the radio-frequency storage signal via the first transformer.

The system described herein is based on the surprising insight that complicated software control is not absolutely necessary for compensating for a possible crosstalk current in an ion trap. Rather, a compensation of a possible crosstalk current is possible more simply using simple electronic components. The device according to the system described herein has the advantage that the radio-frequency storage signal can be coupled or is coupled into the first electrode in antiphase, for example with a phase rotated by 180°, using the first transformer. As a result, hardly any voltages arise between the ring electrode and the first electrode or the ring electrode and the second electrode. Therefore, hardly any crosstalk current arises between the ring electrode and the first electrode (or the ring electrode and the second electrode; this is explained further below). Basically, therefore, a possible crosstalk current is substantially compensated for from the outset by the coupling-in of the radio-frequency storage signal with a phase rotated by 180°. On account of the first transformer, the amplitude of a compensation current used for this purpose is designed to be proportional to the amplitude of the current made available by the amplifier. Furthermore, on account of the first transformer, a phase shift occurs between the current made available by the amplifier and the compensation current. Furthermore, the first transformer serves for the galvanic isolation of that region of the device in which the radio-frequency storage signal is generated from the region of the device in which a measurement current for detecting the ion or the ions is ascertained. Furthermore, the first transformer also serves to transfer power from that region of the device in which the radio-frequency storage signal is generated into that region of the device in which the measurement current is ascertained.

In an embodiment of the device according to the system described herein, it is additionally or alternatively provided that the ring electrode has at least one second opening. Furthermore, the ion trap has at least one second electrode (also called second end cap electrode) arranged at the second opening.

In order to achieve the abovementioned advantages particularly well, in a further embodiment of the device according to the system described herein, it is additionally or alternatively provided that the device has at least one primary transformer. Moreover, the primary transformer and the first transformer have an identical transformer core and an identical primary winding. In other words, both the primary transformer and the first transformer use the same transformer core and the same primary winding. The primary transformer has a first secondary winding. Furthermore, the first transformer has a second secondary winding, which is different from the first secondary winding. In other words, the primary transformer and the first transformer use different secondary windings. The winding sense of the first secondary winding and the winding sense of the second secondary winding are different.

In an embodiment of the device according to the system described herein it is additionally or alternatively provided that the first electrode is connected to at least one first quartz filter unit. Since it can indeed be the case that, despite the compensation described above, an (albeit low) first crosstalk current of the order of magnitude of a few mA (for example 1 mA to 20 mA) can arise at the first electrode (and/or, if appropriate, a second crosstalk current can arise at the second electrode—this is explained further below), the first quartz filter unit is provided in the embodiment of the device according to the system described herein. The first quartz filter unit serves for filtering the first electrode current measured at the first electrode. The first electrode current is composed of the actual first measurement current (also called first measurement signal) and the first crosstalk current. The crosstalk current still present is filtered out during the filtering of the first electrode current. The first quartz filter unit has the advantage that, on the one hand, it is designed to have very high impedance for the first measurement current and, on the other hand, it acts substantially as a short circuit for the first crosstalk current. It is embodied as an electromechanical filter, for example, which has a quartz oscillator. The latter suppresses specific frequency components in a signal. In this way, it is possible to filter out the crosstalk current and to evaluate the first measurement current, which is tapped off at the first electrode and contains the information about the ion stored in the ion trap or the ions stored in the ion trap, without an interference signal. With regard to filtering out the second crosstalk current, reference is made to the text further below.

In a further configuration of the device according to the system described herein it is additionally or alternatively provided that at least one first variable capacitor is arranged between the first transformer and the first electrode. Furthermore, it is provided, in particular, that the first quartz filter unit is connected to a first circuit node, to which the first variable capacitor and the first electrode are also connected. The first variable capacitor basically acts like a resonance tuning capacitor that serves to tune a resonant frequency of the first quartz filter unit to the storage frequency (for example, the resonant frequency is tuned exactly to the storage frequency). Basically, using the first variable capacitor, it is possible to regulate the compensation of a possible crosstalk current. In the device according to the system described herein, the first transformer brings about a first coarse compensation of the first crosstalk current, which is reduced to a small amount by the first compensation. The first crosstalk current that still remains after the first compensation is then completely compensated for using the first variable capacitor and the first quartz filter device.

In a further embodiment of the device according to the system described herein, it is additionally or alternatively provided that the device has at least one first measurement amplifier for amplifying the first measurement current (that is to say the first measurement signal) tapped off at the first electrode. Furthermore, a first excitation unit is provided in this exemplary embodiment of the device according to the system described herein. The first electrode and the first excitation unit for generating a first excitation signal for the first electrode are connected to an input of the first measurement amplifier. Using the first excitation signal, the ion stored in the interior or the ions stored in the interior is/are excited to effect oscillations, the frequency of which is dependent on the ion mass of the individual ion. The oscillations induce image charges at the first electrode which lead to the first measurement current. With regard to the second measurement current, reference is made to the text further below.

In a further configuration of the device according to the system described herein, it is additionally or alternatively provided that the device has at least one of the following features:
  a first switch is arranged between the first electrode and the first excitation unit; or
  a second switch is arranged between the first excitation unit and the first measurement amplifier.

Using the first switch and/or the second switch, it is possible to switch between a first operating mode (that is to say a normal operating mode) and a second operating mode (that is to say an adaptation operating mode) of the ion trap. The normal operating mode corresponds to a measurement operating mode. The adaptation operating mode corresponds to an excitation operating mode. By way of example, in the first operating mode, the first switch is in a first switching state and/or the second switch is in a second switching state. In this first operating mode, the first electrode current is measured and evaluated in order to obtain information about the ion stored in the interior or the ions stored in the interior. By way of example, in the second operating mode, the first switch is in a third switching state and/or the second switch is in a fourth switching state. In the adaptation operating mode, for example, the first excitation signal, for example its amplitude and frequency, is set. The first excitation signal can have any desired temporal profile. By way of example, the profile is sinusoidal or has a delta waveform. However, the system described herein is not restricted to these exemplary embodiments. Rather, any desired suitable temporal profile can be used in the system described herein.

In a further embodiment of the device according to the system described herein, it is additionally or alternatively provided that the device has at least one second transformer which is connected to the amplifier and to the second electrode in such a way that the radio-frequency storage signal is coupled into the second electrode via the second transformer. In other words, the connection of the amplifier to the second electrode is designed for coupling in the radio-frequency storage signal via the second transformer. The same advantages that have already been described further above are achieved here. The radio-frequency storage signal can be coupled into the second electrode or is coupled into the second electrode in antiphase, for example with a phase rotated by 180°, using the second transformer. As a result, hardly any voltages arise between the ring electrode and the second electrode. Therefore, hardly any second crosstalk current arises between the ring electrode and the second electrode. Basically, therefore, a possible second crosstalk current is substantially compensated for from the outset by the coupling-in of the radio-frequency storage signal with a phase rotated by 180°.

In a further embodiment of the device according to the system described herein, it is additionally or alternatively provided that the primary transformer and the second transformer have the identical transformer core and the identical primary winding. Consequently, it is provided here that both the primary transformer and the second transformer use the same transformer core and the same primary winding. As already mentioned above, the primary transformer has the first secondary winding. Furthermore, the second transformer has a third secondary winding, which is different from the first secondary winding. The winding sense of the first secondary winding and the winding sense of the third secondary winding are different. This embodiment of the device according to the system described herein is likewise used in order to achieve the above-mentioned advantages particularly well.

In an embodiment of the device according to the system described herein, it is additionally or alternatively provided that the second electrode is connected to at least one second quartz filter unit. Since it can indeed be the case that, despite the compensation described above, an (albeit low) second crosstalk current can arise at the second electrode, the second quartz filter unit is provided in the embodiment of the particle beam apparatus according to the system described herein. The second quartz filter unit serves for filtering the second electrode current measured at the second electrode. The second electrode current is composed of the actual second measurement current and the second crosstalk current. The second crosstalk current that is still present is filtered out during the filtering of the second electrode current. The second quartz filter unit is embodied identically to the first quartz filter unit, for example. Therefore, reference is made to the remarks made above concerning the first quartz filter unit.

In a further configuration of the device according to the system described herein, it is additionally or alternatively provided that at least one second variable capacitor is arranged between the second transformer and the second electrode. Furthermore, the second quartz filter unit is connected to a second circuit node, to which the second variable capacitor and the second electrode are also connected. The second variable capacitor basically acts like a resonance tuning capacitor that serves to tune a resonant frequency of the second quartz filter unit to the storage frequency (by way of example, the resonant frequency is tuned exactly to the storage frequency).

Basically, using the second variable capacitor, it is possible to regulate the compensation of a possible second crosstalk current. In the device according to the system described herein, the second transformer brings about a first coarse compensation of the second crosstalk current, which is reduced to a small amount by this first compensation. The second crosstalk current that still remains after the first compensation is then completely compensated for using the second variable capacitor and the second quartz filter unit.

In a further embodiment of the device according to the system described herein, it is additionally or alternatively provided that the device has at least one second measurement amplifier for amplifying the second measurement current, which is tapped off at the second electrode. Furthermore, a second excitation unit for generating a second excitation signal for the second electrode is provided. The second electrode and the second excitation unit for generating a second excitation signal for the second electrode are connected to an input of the second measurement amplifier. Using the second excitation signal, the ion stored in the interior or the ions stored in the interior is/are excited to effect oscillations, the frequency of which is dependent on the ion mass of the individual ion. The oscillations induce image charges at the second electrode which lead to the second measurement current.

In a further configuration of the device according to the system described herein, it is additionally or alternatively provided that the device has at least one of the following features:
 a third switch is arranged between the second electrode and the second excitation unit; or
 a fourth switch is arranged between the second excitation unit and the second measurement amplifier.

Using the third switch and/or the fourth switch, it is possible to switch between the first operating mode (that is to say the normal operating mode) and the second operating mode (that is to say the adaptation operating mode) of the ion trap. By way of example, in the first operating mode, the third switch is in a fifth switching state and/or the fourth switch is in a sixth switching state. In this first operating mode, the second electrode current is measured and evaluated in order to obtain information about the ion stored in the interior or the ions stored in the interior. By way of example, in the second operating mode, the third switch is in a seventh switching state and/or the second switch is in an eighth switching state. In the adaptation operating mode, by way of example, the second excitation signal, in particular its amplitude and frequency, is set. The second excitation signal can have any desired temporal profile. By way of example, the profile is sinusoidal or has a delta waveform. However, the system described herein is not restricted to these exemplary embodiments. Rather, any desired suitable temporal profile can be used in the system described herein.

The system described herein also relates to a measuring apparatus comprising at least one ion generating unit and comprising at least one device for mass selective determination of the ion or of the plurality of ions, which has at least one feature mentioned further above or further below or a combination of at least two of the features mentioned further above or further below. By way of example, the ion generating unit has at least one irradiation unit, wherein the irradiation unit has at least one beam generator for generating a particle beam comprising charged particles or for generating a light beam and at least one objective lens for focusing the particle beam or the light beam onto an object, wherein at least one ion is generated when the particle beam or the light beam is incident on the object.

However, the ion generating unit is not restricted to the use of a particle beam or light beam for generating ions at the object. Moreover, the ions can be generated at the object by any suitable way, for example also using a plasma unit. By way of example, ions can be generated in a space alongside the device according to the system described herein and subsequently be conducted into the device according to the system described herein.

BRIEF DESCRIPTION OF THE DRAWINGS

Embodiments of the system described herein are described in greater detail below on the basis of the figures, in which.

DETAILED DESCRIPTION OF VARIOUS EMBODIMENTS

Figure 1:
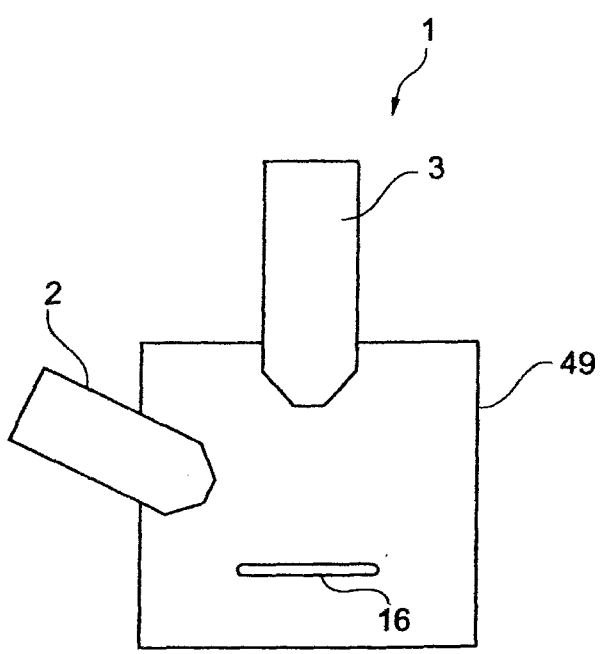
FIG. 1 shows a first schematic illustration of a measuring apparatus comprising an electron beam column and an ion generating unit for generating ions.

FIG. 1 shows a schematic illustration of one embodiment of a measuring apparatus 1 according to the system described herein, comprising a device according to the system described herein for mass selective determination of ions.

The measuring apparatus 1 has a first beam column 2 for generating ions and a second beam column 3 in the form of a particle beam column. The second beam column is embodied as an electron beam column. The first beam column 2 is embodied for example as a laser beam unit, as an ion beam column or as a plasma unit. Furthermore, the first beam column 2 and the second beam column 3 are arranged at a sample chamber 49, in which an object 16 to be examined is arranged. Secondary ions are generated as a result of the irradiation of the object 16 using a laser beam or using ions. This is explained in greater detail further below.

It is explicitly pointed out that the system described herein is not restricted to the first beam column 2 being embodied as an ion beam column or laser beam unit, and the second beam column 3 being embodied as an electron beam column. Rather, the measuring apparatus 1 can have any embodiment which is suitable for generating secondary ions at the object 16.

In further embodiments, the system described herein also provides that the first beam column 2 can be embodied as an electron beam column and the second beam column 3 can be embodied as an ion beam column. A further embodiment of the system described herein provides for both the first beam column 2 and the second beam column 3 to be embodied in each case as an ion beam column. In still further embodiments, it is provided that the measuring apparatus 1 is equipped only with a single beam column, for example the first beam column 2. The latter is then embodied for example as an ion beam column or as a laser beam unit in order to generate secondary ions at the object 16.

Figure 2:
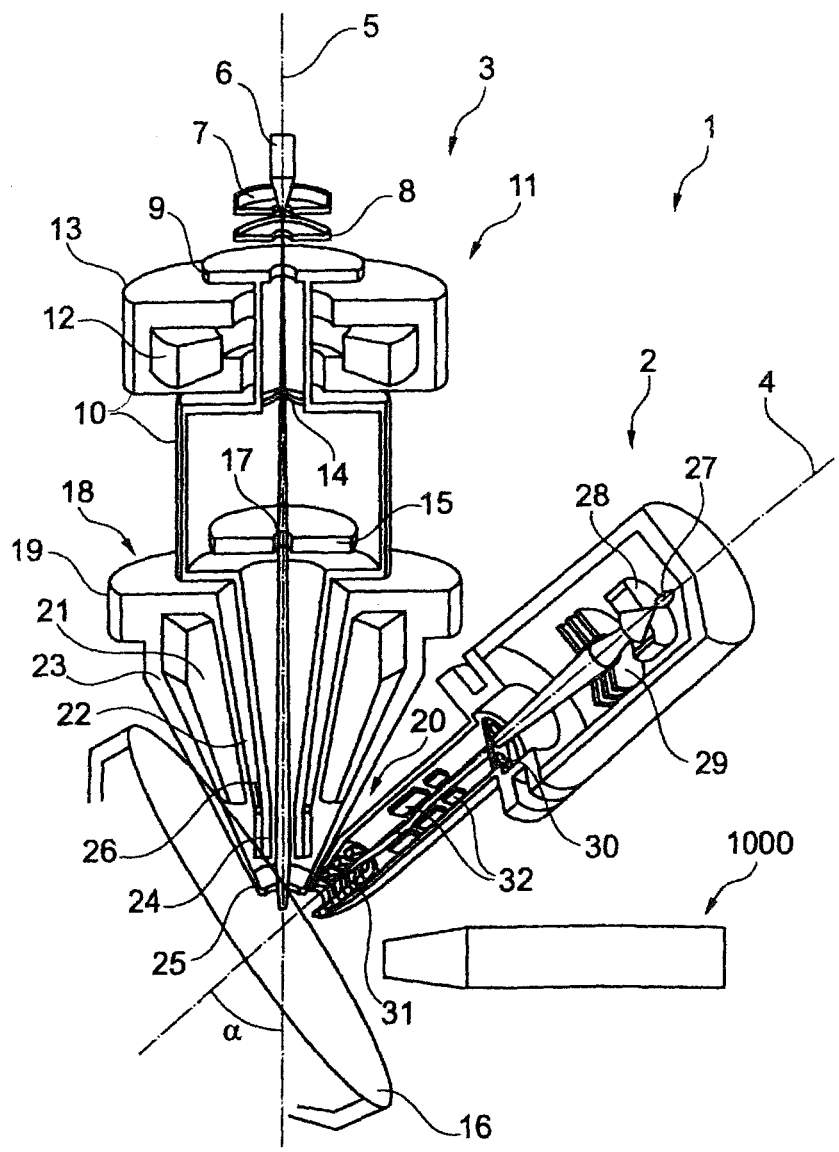
FIG. 2 shows a second schematic illustration in the form of an elevation of an embodiment of the measuring apparatus in accordance with FIG. 1.

FIG. 2 shows an embodiment of the measuring apparatus 1 from FIG. 1 in a detailed illustration. The sample chamber 49 is not illustrated, for reasons of clarity. In the embodiment illustrated in FIG. 2, the first beam column 2 is embodied as an ion beam column having a first optical axis 4. Furthermore, the second beam column 3 in the form of the electron beam column has a second optical axis 5.

Firstly, the second beam column 3 in the form of the electron beam column will now be discussed below. The second beam column 3 has a second beam generator 6, a first electrode 7, a second electrode 8 and a third electrode 9. By way of example, the second beam generator 6 is a thermal field emitter. The first electrode 7 has the function of a suppressor electrode, while the second electrode 8 has the function of an extractor electrode. The third electrode 9 is embodied as an anode and simultaneously forms one end of a beam guiding tube 10. A second particle beam in the form of an electron beam is generated using the second beam generator 6. Electrons which emerge from the second beam generator 6 are accelerated to anode potential, for example in the range of 1 kV to 30 kV, on account of a potential difference between the second beam generator 6 and the third electrode 9. The second particle beam in the form of the electron beam passes through the beam guiding tube 10 and is focused onto the object 16 to be examined. This will be discussed in greater detail further below.

The beam guiding tube 10 has a collimator arrangement 11 (in this case a condenser), which has a first ring coil 12 and a yoke 13. Arranged downstream of the collimator arrangement 11, as seen from the second beam generator 6 in the direction of the object 16, there are a pinhole diaphragm 14 and a detector 15 having a central opening 17 in the beam guiding tube 10 along the second optical axis 5. The beam guiding tube 10 then runs through a hole in a second objective lens 18. The second objective lens 18 serves for focusing the second particle beam onto the object 16. For this purpose, the second objective lens 18 has a magnetic lens 19 and an electrostatic lens 20. The magnetic lens is provided with a second ring coil 21, an inner pole piece 22 and an outer pole piece 23. The electrostatic lens 20 has one end 24 of the beam guiding tube 10 and a terminating electrode 25. The end of the beam guiding tube 10 and the terminating electrode 25 form an electrostatic retardation unit. The end 24 of the beam guiding tube 10 together with the beam guiding tube 10 is at anode potential, while the terminating electrode 25 and the object 16 are at a lower potential relative to the anode potential. In this way, the electrons of the second particle beam can be decelerated to a desired energy required for the examination of the object 16. Moreover, the second beam column 3 has a scanning unit 26, by which the second particle beam can be deflected and scanned over the object 16.

For imaging purposes, the detector 15 arranged in the beam guiding tube 10 is used to detect secondary electrons and/or backscattered electrons which arise on account of the interaction of the second particle beam with the object 16. The signals generated by the detector 15 are communicated to an electronic unit (not illustrated) for imaging purposes. The object 16 is arranged on a sample carrier (not illustrated) with which the object 16 is arranged movably in three axes arranged perpendicularly to one another (namely an x-axis, a y-axis and a z-axis). Moreover, the sample carrier can be rotated about two rotation axes arranged perpendicularly to one another. It is thus possible to bring the object 16 into a desired position.

As already mentioned above, the reference sign 2 identifies the first beam column in the form of the ion beam column. The first beam column 2 has a first beam generator 27 in the form of an ion source. The first beam generator 27 serves for generating a first particle beam in the form of an ion beam. Furthermore, the first beam column 2 is provided with an extraction electrode 28 and a collimator 29. A variable diaphragm 30 is disposed downstream of the collimator 29 along the first optical axis 4 in the direction of the object 16. The first particle beam is focused onto the object using a first objective lens 31 in the form of focusing lenses. Scanning electrodes 32 are provided in order to scan the first particle beam over the object 16.

Figure 3:
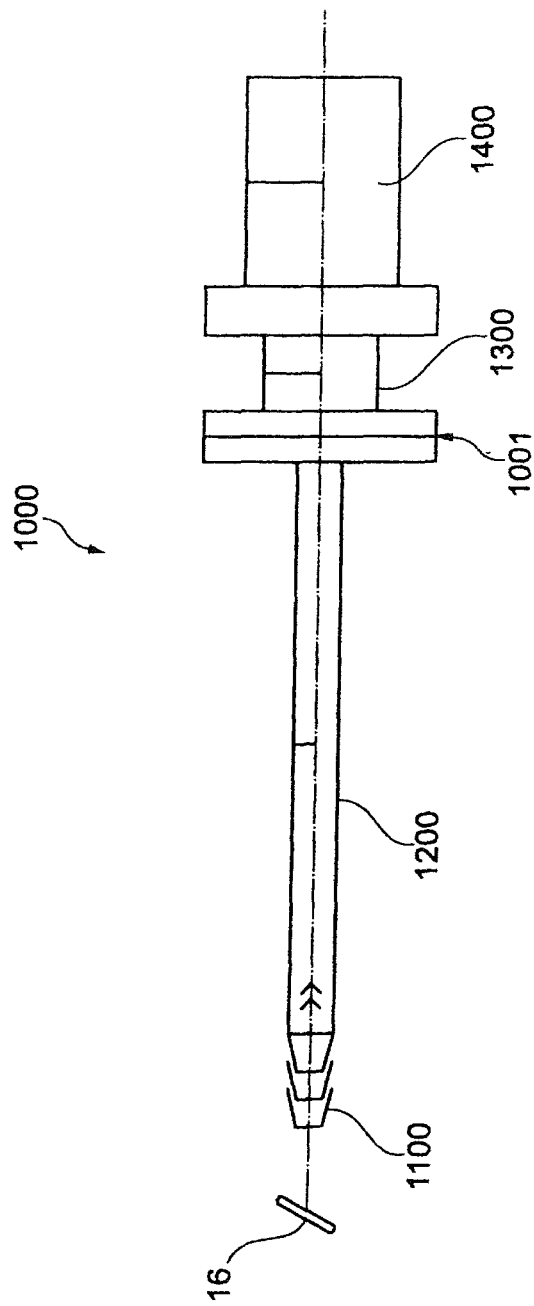
FIG. 3 shows a schematic illustration of a particle analysis device.

FIG. 2 furthermore shows a particle analysis device 1000, which is likewise shown in a schematic side view in FIG. 3. The particle analysis device 1000 has a collecting device in the form of an extraction unit 1100, a device for energy transfer 1200, an ion transfer unit 1300 and an analysis unit 1400. The ion transfer unit 1300 and the analysis unit 1400 are arranged on the sample chamber 49 releasably using a connecting element 1001. In this way it is possible to use different analysis units.

Secondary ions which arise when the object 16 is irradiated with the first particle beam are extracted using the extraction unit 1100. The secondary ions then pass into the device for energy transfer 1200. The device for energy transfer 1200 can fulfill two functions. Firstly, the secondary ions are forwarded using the device for energy transfer 1200 from the extraction unit 1100 in the direction of the analysis unit 1400. Secondly, it can additionally be provided that the secondary ions transfer their energy to neutral gas particles and are thus decelerated in the device for energy transfer 1200. After passing through the device for energy transfer 1200 and after possible deceleration, the secondary ions are transported into the analysis unit 1400 using the ion transfer unit 1300. In the exemplary embodiment illustrated here, the analysis unit 1400 (that is to say a detection unit) is embodied as an ion trap mass spectrometer. It is illustrated in greater detail in FIG. 4.

Figure 4:
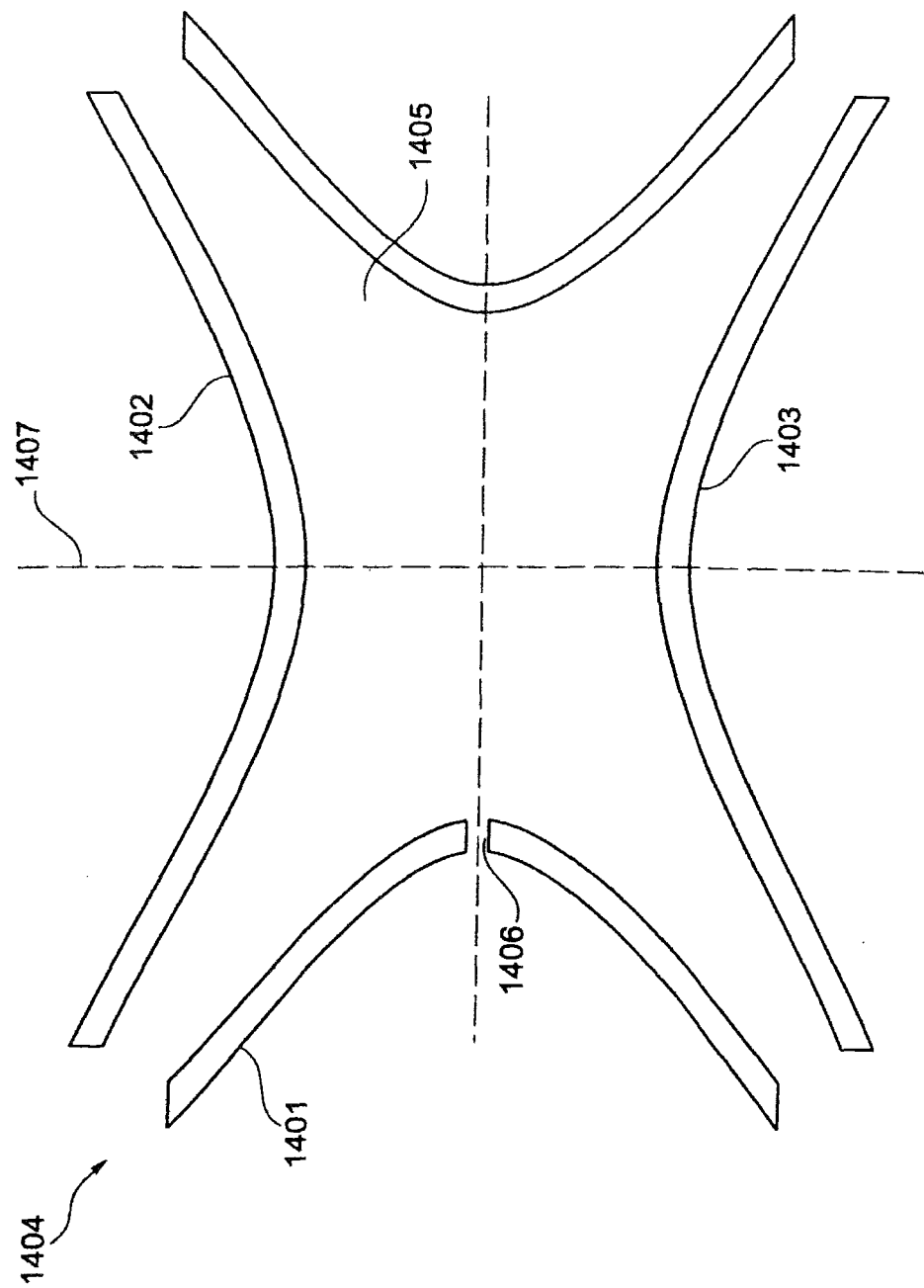
FIG. 4 shows a schematic illustration in the form of a sectional illustration of a storage cell of an ion trap.

FIG. 4 shows a schematic illustration of a storage cell 1404 of an ion trap mass spectrometer. The storage cell 1404 is embodied as a Paul trap and has a ring electrode 1401, a first end cap electrode 1402 and a second end cap electrode 1403. The ring electrode 1401 is arranged rotationally symmetrically about a first axis 1407. The first end cap electrode 1402 and the second end cap electrode 1403 are likewise arranged rotationally symmetrically about the first axis 1407. The ring electrode 1401 has an opening 1406 through which the secondary ions can be coupled from the ion transfer unit 1300 into an interior 1405 of the storage cell 1404. The interior 1405 is encompassed by the ring electrode 1401, by the first end cap electrode 1402 and by the second end cap electrode 1403.

Figure 5:
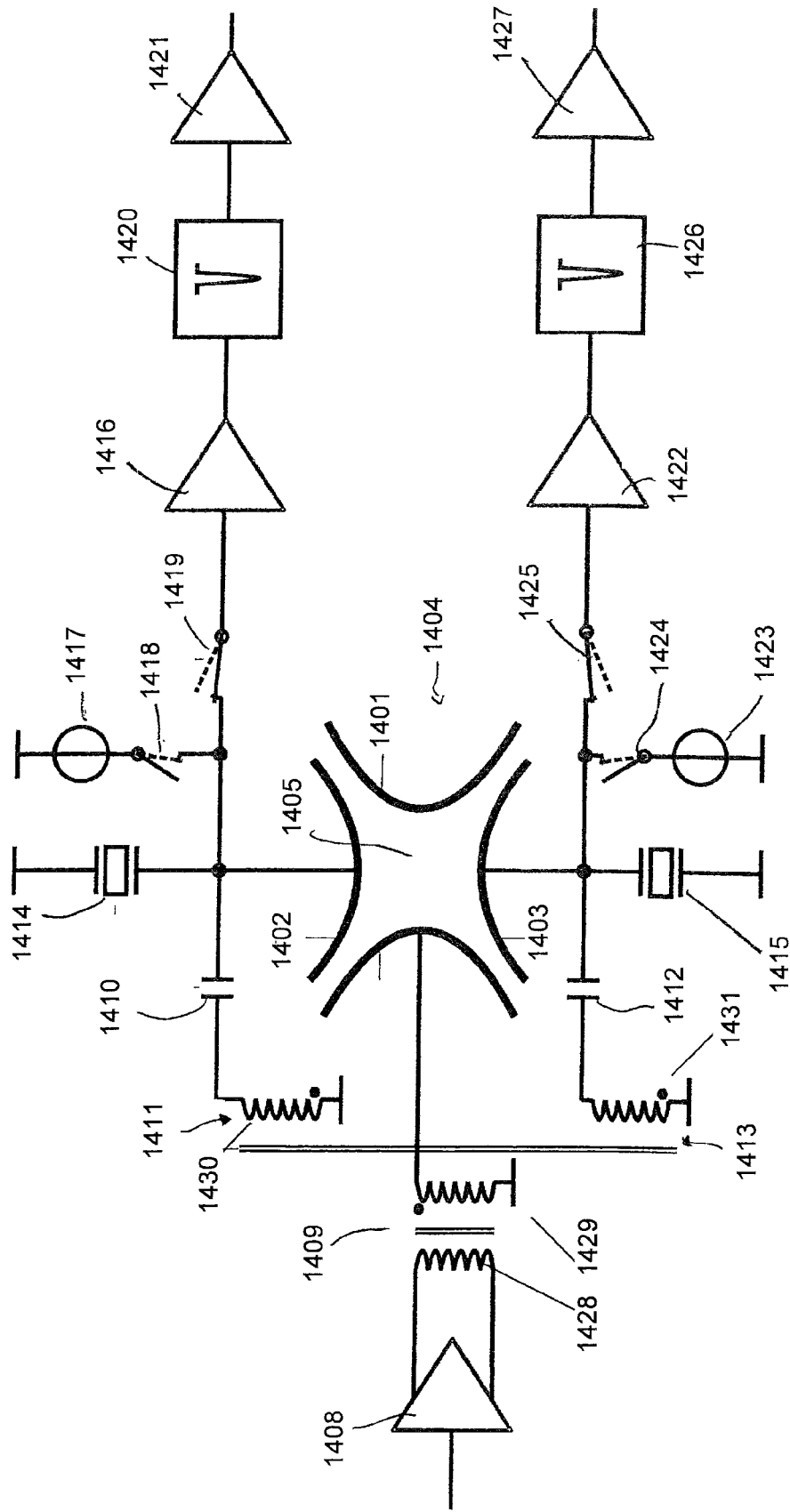
FIG. 5 shows a detailed illustration of the ion trap in accordance with FIG. 4 with a control and measurement unit.

FIG. 5 shows the construction of the ion trap together with a control and measurement unit in a detailed illustration. Firstly, the individual units of the ion trap and the arrangement thereof will be described briefly. Afterward, the function thereof will be discussed in greater detail.

FIG. 5 shows the storage cell 1404. The ring electrode 1401, the first end cap electrode 1402 and the second end cap electrode 1403 are again illustrated. The measuring apparatus 1 according to the system described herein furthermore has an amplifier 1408, which is connected to a primary transformer 1409. The primary transformer 1409 is in turn connected to the ring electrode 1401. The amplifier 1408 serves for amplifying a radio-frequency storage signal. Said radio-frequency storage signal is forwarded to the ring electrode 1401 using the primary transformer 1409. An alternating field then arises in the interior 1405, by which alternating field an ion or a plurality of ions can be stored in the interior 1405 of the storage cell 1404.

The first end cap electrode 1402 is connected to a first capacitor 1410. The first capacitor 1410 is in turn connected to a first transformer 1411. The second end cap electrode 1403 is connected to a second capacitor 1412. The second capacitor 1412 is in turn connected to a second transformer 1413.

The primary transformer 1409, the first transformer 1411 and the second transformer 1413 have an identical transformer core and an identical primary winding 1428. Consequently, it is provided here that both the primary transformer 1409 and the first transformer 1411 and the second transformer 1413 use the same transformer core and the same primary winding 1428. The primary transformer 1409 has a first secondary winding 1429. Furthermore, the first transformer 1411 has a second secondary winding 1430, which is different from the first secondary winding 1429. Furthermore, the second transformer 1413 has a third secondary winding 1431, which is different from the first secondary winding 1429 and different from the second secondary winding 1430. The winding sense of the first secondary winding 1429, on the one hand, and the winding sense of the second secondary winding 1430 and of the third secondary winding 1431, on the other hand, are different. By way of example, they are wound with opposite polarity.

The first end cap electrode 1402 is furthermore connected to a first quartz filter unit 1414. Furthermore, the second end cap electrode 1403 is connected to a second quartz filter unit 1415.

Furthermore, a first measurement amplifier 1416 is provided in the measuring apparatus 1 according to the system described herein, said measurement amplifier being connected to the first end cap electrode 1402. A first excitation unit 1417 is connected between the first end cap electrode 1402 and the first measurement amplifier 1416, wherein a first switch 1418 is connected between the first end cap electrode 1402 and the first excitation unit 1417. Furthermore, a second switch 1419 is connected between the first end cap electrode 1402 and the first excitation unit 1417, on the one hand, and the first measurement amplifier 1416, on the other hand. The first measurement amplifier 1416 is followed by a first filter 1420, which is in turn followed by a first signal amplifier 1421. The switches described above can also be arranged at a different position, as long as the measurement properties and excitation properties which have already been mentioned further above or will be mentioned further below are ensured. By way of example, the second switch 1419 can also be arranged between the first measurement amplifier 1416 and the first signal amplifier 1421.

A second measurement amplifier 1422 is provided in the measuring apparatus 1 according to the system described herein, said second measurement amplifier being connected to the second end cap electrode 1403. A second excitation unit 1423 is connected between the second end cap electrode 1403 and the third amplifier 1422, wherein a third switch 1424 is connected between the second end cap electrode 1403 and the second excitation unit 1423. Furthermore, a fourth switch 1425 is connected between the second end cap electrode 1403 and the second excitation unit 1423, on the one hand, and the second measurement amplifier 1422, on the other hand. The second measurement amplifier 1422 is followed by a second filter 1426, which is in turn followed by a second signal amplifier 1427.

The radio-frequency storage signal (that is to say the storage frequency) is coupled into the first end cap electrode 1402 using the first transformer 1411 with a phase rotated by 180°. As a result, hardly any voltages arise between the ring electrode 1401 and the first end cap electrode 1402. Therefore, hardly any crosstalk current arises between the ring electrode 1401 and the first end cap electrode 1402. Basically, therefore, a possible crosstalk current is substantially compensated for from the outset by the coupling-in of the radio-frequency storage signal with a phase rotated by 180°. However, this does not rule out a situation where an (albeit low) first crosstalk current nevertheless arises. As will be explained further below, this first crosstalk current is filtered out.

The radio-frequency storage signal (that is to say the storage frequency) is furthermore coupled into the second end cap electrode 1403 using the second transformer 1413 with a phase rotated by 180°. As a result, hardly any voltages arise between the ring electrode 1401 and the second end cap electrode 1403. Therefore, hardly any crosstalk current arises between the ring electrode 1401 and the second end cap electrode 1403. Basically, therefore, a possible crosstalk current is substantially compensated for from the outset by the coupling-in of the radio-frequency storage signal with a phase rotated by 180°. However, here as well this does not rule out a situation where an (albeit low) second crosstalk current nevertheless arises. As will be explained further below, this second crosstalk current is filtered out.

The first excitation unit 1417 serves for generating a first excitation signal. Using the first excitation signal, the ion stored in the interior 1405 or the ions stored in the interior 1405 is/are excited to effect oscillations, the frequency of which is dependent on the ion mass of the individual ion. The oscillations induce image charges at the first end cap electrode 1402 which lead to the first measurement current.

The second excitation unit 1423 serves for generating a second excitation signal. Using the second excitation signal, the ion stored in the interior 1405 or the ions stored in the interior 1405 is/are likewise excited to effect oscillations, the frequency of which is dependent on the ion mass of the individual ion. The oscillations induce image charges at the second end cap electrode 1403 which lead to the second measurement current.

As described above, it can indeed be the case that, despite the compensation described above, an (albeit low) first crosstalk current can arise at the first end cap electrode 1402. In order to filter out this first crosstalk current, the first quartz filter unit 1414 is arranged at the ion trap of the measuring apparatus 1. The first quartz filter unit 1414 serves for filtering the first electrode current measured at the first end cap electrode 1402. The first electrode current is composed of the actual first measurement current (the first measurement signal) and the first crosstalk current. The crosstalk current that is still present is filtered out during the filtering of the first electrode current. The first quartz filter unit 1414 constitutes a short circuit for the first crosstalk current, on the one hand, and acts as a high impedance for the first measurement current. It is embodied as an electromechanical filter, for example, which has a quartz oscillator. As a result of the first crosstalk current being filtered out, only the first measurement current remains in the first electrode current, which then contains the information about the ions stored in the ion trap.

As furthermore described above, it can indeed be the case that, despite the compensation described above, an (albeit low) second crosstalk current can arise at the second end cap electrode 1403. In order to filter out this second crosstalk current, the second quartz filter unit 1415 is arranged at the ion trap of the measuring apparatus 1. The second quartz filter unit 1415 serves for filtering the second electrode current measured at the second end cap electrode 1403. The second electrode current is composed of the actual second measurement current (the second measurement signal) and the second crosstalk current. The second crosstalk current that is still present is filtered out during the filtering of the second electrode current. The second quartz filter unit 1415 constitutes a short circuit for the second crosstalk current, on the one hand, and acts as a high impedance for the second measurement current. It is embodied as an electromechanical filter, for example, which has a quartz oscillator. As a result of the second crosstalk current being filtered out, only the second measurement current remains in the second electrode current, which then contains the information about the ions stored in the ion trap.

Basically, the first variable capacitor 1410 acts like a resonance tuning capacitor that serves to tune a resonant frequency of the first quartz filter unit 1414 to the storage frequency. Basically, using the first variable capacitor 1410, it is possible to regulate the compensation of the possible first crosstalk current. The same analogously applies to the second variable capacitor 1412. Basically, the second variable capacitor 1412 acts like a resonance tuning capacitor that serves to tune a resonant frequency of the second quartz filter unit 1415 to the storage frequency. Basically, using the second variable capacitor 1412, it is possible to regulate the compensation of the possible second crosstalk current.

In the measuring apparatus 1 according to the system described herein, the first transformer 1411 brings about a first coarse compensation of the first crosstalk current, which is reduced to a small amount by this first compensation. The first crosstalk current that still remains after the first compensation is then compensated for using the first variable capacitor 1410 and the first quartz filter unit 1414. In the measuring apparatus 1 according to the system described herein, the second transformer 1413 brings about a first coarse compensation of the second crosstalk current, which is reduced to a small amount by the first compensation. The second crosstalk current that still remains after the first compensation is then compensated for using the second variable capacitor 1412 and the second quartz filter unit 1415.

The first measurement amplifier 1416 serves for amplifying the first measurement current (the first measurement signal). The amplified first measurement current is subsequently filtered using the first filter 1420. Crosstalk signals of the radio-frequency storage signal are filtered out during the filtering of the first measurement current. Afterward, the signal filtered by the first filter 1420 is once again amplified using the first signal amplifier 1421 and forwarded to an evaluation unit (not illustrated) for evaluation (that is to say for ascertaining the type of the ion or ions).

The second measurement amplifier 1422 serves for amplifying the second measurement current (that is to say the second measurement signal). The amplified second measurement current is subsequently filtered using the second filter 1426. Here, too, crosstalk signals of the radio-frequency storage signal are filtered out during the filtering of the second measurement current. Afterward, the signal filtered by the second filter 1426 is once again amplified using the second signal amplifier 1427 and forwarded to the evaluation unit (not illustrated) for evaluation (that is to say for ascertaining the type of the ion or ions).

Using the first switch 1418 and/or the second switch 1419, it is possible to switch between a first operating mode (that is to say a normal operating mode) and a second operating mode (that is to say an adaptation operating mode) of the ion trap. By way of example, in the first operating mode, the first switch 1418 is in an open state. In the first operating mode, the second switch 1419 is in a closed state. In this first operating mode, the first electrode current is measured, filtered and evaluated.

In the first operating mode (that is to say in the normal operating mode), the third switch 1424 is in an open state. Furthermore, the fourth switch 1425 is in a closed state in the first operating mode. In this first operating mode, the second electrode current is measured, filtered and evaluated.

In the second operating mode (that is to say the adaptation operating mode), the first switch 1418 is closed. Furthermore, the second switch 1419 is in an open state in the second operating mode. The same analogously applies to the third switch 1424 and the fourth switch 1425. In the second operating mode (that is to say the adaptation operating mode), the third switch 1424 is closed. Furthermore, the fourth switch 1425 is in an open state in the second operating mode. In the adaptation operating mode, the first excitation signal and the second excitation signal (for example the amplitude and frequency thereof) are set. As already mentioned above, the first excitation signal and the second excitation signal can have any desired temporal profile.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

In a manner consistent with the description herein, software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A device for mass selective determination of at least one ion, comprising:
    at least one ion trap for storing at least one ion, wherein the ion trap has at least one ring electrode, wherein the ring electrode has at least one first opening, wherein the ion trap has at least one first electrode arranged at the first opening;
    at least one amplifier for providing a radio-frequency storage signal for the ion trap;
    at least one first transformer which is connected to the amplifier and the first electrode in such a way that the radio-frequency storage signal is coupled into the first electrode via the first transformer; and
    at least one primary transformer, wherein the primary transformer and the first transformer have an identical transformer core and an identical primary winding, wherein the primary transformer has a first secondary winding, wherein the first transformer has a second secondary winding, which is different from the first secondary winding, and wherein a winding sense of the first secondary winding and a winding sense of the second secondary winding are different.

2. The device according to claim 1, wherein the ring electrode has at least one second opening, and wherein the ion trap has at least one second electrode arranged at the second opening.

3. The device according to claim 2, further comprising:
    at least one second transformer which is connected to the amplifier and to the second electrode in such a way that the radio-frequency storage signal is coupled into the second electrode via the second transformer.

4. The device according to claim 3, wherein the second electrode is connected to at least one second quartz filter unit.

5. The device according to claim 4, further comprising:
at least one second variable capacitor connected between the second transformer and the second electrode, wherein the second quartz filter unit is connected to a second circuit node, to which the second variable capacitor and the second electrode are also connected.

6. The device according to claim 2, further comprising:
at least one second measurement amplifier for amplifying a second measurement signal of the second electrode, wherein the second electrode and a second excitation unit for generating a second excitation signal for the second electrode are connected to an input of the second measurement amplifier.

7. The device according to claim 6, further comprising at least one of the following:
(i) a third switch arranged between the second electrode and the second excitation unit; or
(ii) a fourth switch arranged between the second excitation unit and the second amplifier.

8. The device according to claim 1, further comprising:
at least one first quartz filter unit connected to the first electrode.

9. The device according to claim 8, further comprising:
at least one first variable capacitor connected between the first transformer and the first electrode, wherein the first quartz filter unit is connected to a first circuit node, to which the first variable capacitor and the first electrode are also connected.

10. The device according to claim 1, further comprising:
at least one first measurement amplifier for amplifying a first measurement signal of the first electrode; and
a first excitation unit for generating a first excitation signal for the first electrode, wherein the first electrode and the first excitation unit are connected to an input of the first measurement amplifier.

11. The device according to claim 10, further comprising at least one of the following:
(i) a first switch arranged between the first electrode and the first excitation unit; or
(ii) a second switch arranged between the first excitation unit and the first measurement amplifier.

12. The device according to claim 1, wherein the primary transformer and a second transformer have the identical transformer core and the identical primary winding, wherein the primary transformer has the first secondary winding, wherein the second transformer has a third secondary winding, which is different from the first secondary winding, and wherein the winding sense of the first secondary winding and a winding sense of the third secondary winding are different.

13. A measuring apparatus, comprising:
at least one ion generating unit; and
a device for mass selective determination of at least one ion, the device including:
at least one ion trap for storing at least one ion, wherein the ion trap has at least one ring electrode, wherein the ring electrode has at least one first opening, wherein the ion trap has at least one first electrode arranged at the first opening;
at least one amplifier for providing a radio-frequency storage signal for the ion trap;
at least one first transformer which is connected to the amplifier and the first electrode in such a way that the radio-frequency storage signal is coupled into the first electrode via the first transformer; and
at least one primary transformer, wherein the primary transformer and the first transformer have an identical transformer core and an identical primary winding, wherein the primary transformer has a first secondary winding, wherein the first transformer has a second secondary winding, which is different from the first secondary winding, and wherein a winding sense of the first secondary winding and a winding sense of the second secondary winding are different.

14. The measuring apparatus according to claim 13, wherein the ion generating unit has at least one of the following features:
(i) at least one irradiation unit, wherein the irradiation unit has at least one beam generator for generating a particle beam comprising charged particles or for generating a light beam and at least one objective lens for focusing the particle beam or the light beam onto an object, wherein at least one ion is generated when the particle beam or the light beam is incident on the object; or
(ii) at least one plasma unit for generating ions using a plasma.

15. The measuring apparatus according to claim 13, wherein the ring electrode has at least one second opening, and wherein the ion trap has at least one second electrode arranged at the second opening.

16. The measuring apparatus according to claim 15, wherein the device for mass selective determination further includes:
at least one second transformer which is connected to the amplifier and to the second electrode in such a way that the radio-frequency storage signal is coupled into the second electrode via the second transformer.

17. The measuring apparatus according to claim 16, wherein the second electrode is connected to at least one second quartz filter unit.

18. The measuring apparatus according to claim 17, wherein the device for mass selective determination further includes:
at least one second variable capacitor connected between the second transformer and the second electrode, wherein the second quartz filter unit is connected to a second circuit node, to which the second variable capacitor and the second electrode are also connected.

19. The measuring apparatus according to claim 15, wherein the device for mass selective determination further includes:
at least one second measurement amplifier for amplifying a second measurement signal of the second electrode, wherein the second electrode and a second excitation unit for generating a second excitation signal for the second electrode are connected to an input of the second measurement amplifier.

20. The measuring apparatus according to claim 19, wherein the device for mass selective determination further includes at least one of the following:
(i) a third switch arranged between the second electrode and the second excitation unit; or
(ii) a fourth switch arranged between the second excitation unit and the second amplifier.

21. The measuring apparatus according to claim 13, wherein the device for mass selective determination further includes:
at least one first quartz filter unit connected to the first electrode.

22. The measuring apparatus according to claim 21, wherein the device for mass selective determination further includes:

at least one first variable capacitor connected between the first transformer and the first electrode, and wherein the first quartz filter unit is connected to a first circuit node, to which the first variable capacitor and the first electrode are also connected.

23. The measuring apparatus according to claim 13, wherein the device for mass selective determination further includes:
- at least one first measurement amplifier for amplifying a first measurement signal of the first electrode; and
- a first excitation unit for generating a first excitation signal for the first electrode, wherein the first electrode and the first excitation unit are connected to an input of the first measurement amplifier.

24. The measuring apparatus according to claim 23, wherein the device for mass selective determination further includes at least one of the following:
(i) a first switch arranged between the first electrode and the first excitation unit; or
(ii) a second switch arranged between the first excitation unit and the first measurement amplifier.

25. The measuring apparatus according to claim 13, wherein the primary transformer and a second transformer have the identical transformer core and the identical primary winding, wherein the primary transformer has the first secondary winding, wherein the second transformer has a third secondary winding, which is different from the first secondary winding, and wherein the winding sense of the first secondary winding and a winding sense of the third secondary winding are different.

* * * * *